(12) United States Patent
Park et al.

(10) Patent No.: US 8,923,079 B1
(45) Date of Patent: Dec. 30, 2014

(54) SEMICONDUCTOR APPARATUS HAVING A DATA BIT INVERSION FUNCTION

(71) Applicant: SK Hynix Inc., Icheon-si Gyeonggi-do (KR)

(72) Inventors: Heat Bit Park, Icheon-si (KR); Jong Chern Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/064,780

(22) Filed: Oct. 28, 2013

(30) Foreign Application Priority Data

Aug. 30, 2013 (KR) .......................... 10-2013-0103770

(51) Int. Cl.
*G11C 7/10* (2006.01)
*G11C 7/00* (2006.01)

(52) U.S. Cl.
CPC ...................................... *G11C 7/00* (2013.01)
USPC ................................ 365/189.17; 365/230.06

(58) Field of Classification Search
CPC ..................................... G11C 7/10; G11C 8/08
USPC ........................................ 365/189.17, 230.06
See application file for complete search history.

(56) References Cited

U.S. PATENT DOCUMENTS

| 4,509,008 | A | * | 4/1985 | DasGupta et al. | 714/731 |
| 5,781,766 | A | * | 7/1998 | Davis | 713/401 |
| 5,787,097 | A | * | 7/1998 | Roohparvar et al. | 714/722 |
| 5,789,805 | A | * | 8/1998 | Kanekawa et al. | 257/676 |
| 5,978,281 | A | * | 11/1999 | Anand et al. | 365/189.05 |
| 6,338,113 | B1 | * | 1/2002 | Kubo et al. | 711/105 |
| 8,243,467 | B2 | * | 8/2012 | Nakagawa et al. | 361/783 |
| 8,279,100 | B2 | * | 10/2012 | Caci et al. | 341/155 |

FOREIGN PATENT DOCUMENTS

KR      1020120108474 A      10/2012

* cited by examiner

*Primary Examiner* — Michael Tran
(74) *Attorney, Agent, or Firm* — William Park & Associates Patent Ltd.

(57) ABSTRACT

A semiconductor apparatus having a data bit inversion function and, the semiconductor apparatus including a first semiconductor chip and a second semiconductor chip electrically coupled to the first semiconductor chip, wherein the first semiconductor chip may be configured to receive data and a data bit inversion flag, and transfer the data to the second semiconductor chip, and the second semiconductor chip may be configured to invert and store the data, which is transferred from the first semiconductor chip, according to to the data bit inversion flag.

8 Claims, 5 Drawing Sheets

SEMICONDUCTOR APPARATUS HAVING A DATA BIT INVERSION FUNCTION

CROSS-REFERENCES TO RELATED APPLICATION

The present application claims priority under 35 U.S.C. §119(a) to Korean application number 10-2013-0103770, filed on Aug. 30, 2013, in the Korean Intellectual Property Office, which is incorporated herein by reference in its entirety as set forth in full.

BACKGROUND

1. Technical Field

Various embodiments generally relate to a semiconductor apparatus, and more particularly, to a semiconductor apparatus having a data bit inversion function.

2. Related Art

In a semiconductor apparatus, it is important to reduce current consumption in a data transmission operation. As one method for reducing the current consumption, a data bit inversion (DBI) function may be used.

SUMMARY

A semiconductor apparatus having a DBI function capable of reducing current consumption is described herein.

In an embodiment of the present invention, a semiconductor apparatus includes: a semiconductor apparatus has a data bit inversion function and includes a first semiconductor chip and a second semiconductor chip electrically coupled to the first semiconductor chip, wherein the first semiconductor chip may be configured to receive data and a data bit inversion flag, and transfer the data to the second semiconductor chip, and wherein the second semiconductor chip may be configured to invert and store the data, which is transferred from the first semiconductor chip, according to the data bit inversion flag.

In an embodiment of the present invention, a semiconductor apparatus includes: a semiconductor apparatus having a data bit inversion function, the semiconductor apparatus including a first semiconductor chip configured to receive data and a data bit inversion flag from outside the semiconductor apparatus; and a second semiconductor chip configured to be stacked on the first semiconductor chip and to receive the data and the data bit inversion flag through a plurality of through vias, wherein the second semiconductor chip may be configured to invert and store the data according to the data bit inversion flag.

The present technology may be able to reduce the current consumption of a semiconductor apparatus.

BRIEF DESCRIPTION OF THE DRAWINGS

Features, aspects, and embodiments are described in conjunction with the attached drawings, in which.

DETAILED DESCRIPTION

Hereinafter, a semiconductor apparatus having a data bit inversion function according to the present invention will be described in detail with reference to the accompanying drawings through an is embodiment.

Figure 1:
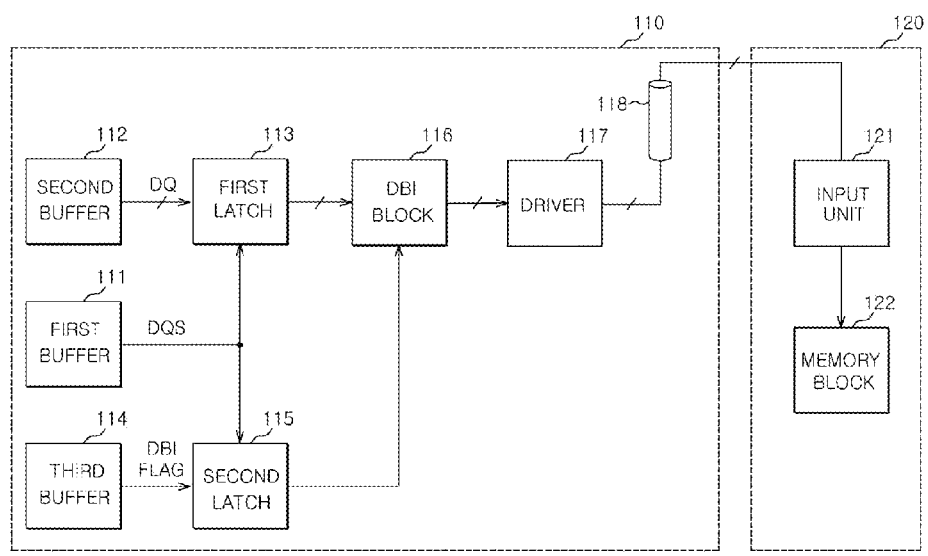
FIG. 1 is a block diagram of a semiconductor apparatus 100 having a DBI function according to an embodiment.

As illustrated in FIG. 1, a semiconductor apparatus 100 having a data bit inversion function (hereinafter, referred to as a DBI function) according to an embodiment may include a first semiconductor chip 110 and a second semiconductor chip 120.

The first semiconductor chip 110 may include a first buffer 111, a second buffer 112, a first latch 113, a third buffer 114, a second latch 115, a DBI block 116, a driver 117, and a plurality of through vias 118.

The first buffer 111 is configured to be electrically coupled to a DQS pin and to buffer a data strobe signal DQS inputted through the DQS pin.

The second buffer 112 is configured to be electrically coupled to a DQ pin and to buffer data DQ inputted through the DQS pin.

The first latch 113 is configured to latch the data DQ, which has been buffered through the second buffer 112, in response to the data strobe signal DQS.

The third buffer 114 is configured to be electrically coupled to a DBI pin and to buffer a data bit inversion flag (hereinafter, a DBI flag) inputted through the DBI pin.

The second latch 115 is configured to latch the DBI flag buffered through the third buffer 114.

The DBI block 116 is configured to invert the data DQ, which has been latched in the first latch 113, or output the data DQ with an original phase according to the DBI flag.

The driver 117 is configured to drive the data DQ, which has been outputted from the DBI block 116, to a level at which the data DQ can be transmitted through the plurality of through vias 118.

The plurality of through vias 118 may include a plurality of through-silicon vias (TSV).

Although not illustrated in FIG. 1, the first semiconductor chip 110 may include an interface-related circuit block for transferring data in and out of the first semiconductor chip 110. Additionally, data strobe signals DQS, and data bit inversion flags DBI FLAG, etc., may be transferred in and out of the first semiconductor chip 110 through the interface-related circuit block and/or a pin. Thus, data DQ as well as data strobe signals DQS, and data bit inversion flags DBI FLAG, etc., external to the first semiconductor chip 110 may be provided from an external apparatus located outside the first semiconductor chip 110. The data DQ as well as data strobe signals DQS, and data bit inversion flags DBI FLAG, etc., may then be received by the first semiconductor chip 110 through the interface-related circuit block and/or pins. Additionally, the data DQ as well as data strobe signals DQS, and data bit inversion flags DBI FLAG, etc., within the first semiconductor chip 110 may be output to an external apparatus through the interface-related circuit block and/or pins. Also, for example, a memory controller through communication with the first semiconductor chip 110 may control the transferring of data DQ in and out of the first semiconductor chip 110 as well as the transferring of data DQ, data strobe signals DQS, and data bit inversion flags DBI FLAG between the second semiconductor chip 120 and the first semiconductor chip 110.

The second semiconductor chip 120 may include an input unit 121 and a memory block 122.

The input unit 121 is an element for receiving the data DQ transmitted through the plurality of through vias 118, and may include an input buffer, a pipe latch and the like.

The memory block 122 is configured to store the data DQ inputted through the input unit 121.

At this time, the first semiconductor chip 110 may be a master and the second semiconductor chip 120 may be a slave.

The aforementioned embodiments may have a three-dimensional structure, that is, a structure in which a plurality of semiconductor chips have been stacked.

That is, FIG. 1 is illustrated as a block diagram. However, actually, the first semiconductor chip 110 and the second semiconductor chip 120 may have a stack structure.

The second semiconductor chip 120 may be stacked on the first semiconductor chip 110, and data transmission/reception may be performed between the first semiconductor chip 110 and the second semiconductor chip 120 through the plurality of through vias 118.

Figure 2:
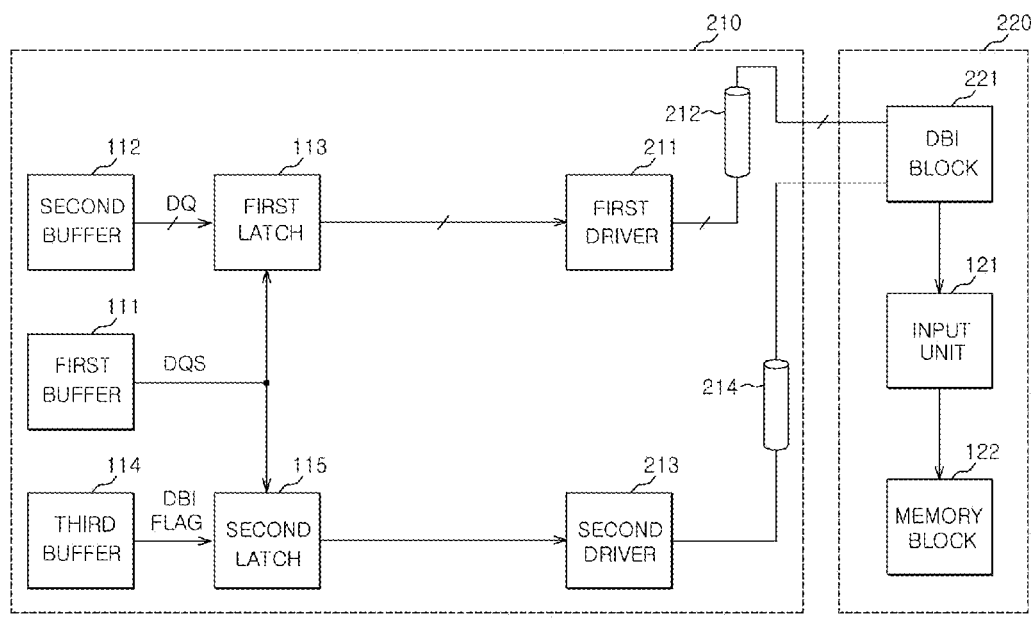
FIG. 2 is a block diagram of a semiconductor apparatus 200 having a DBI function according to an embodiment.

As illustrated in FIG. 2, a semiconductor apparatus 200 having the data bit inversion function according to an embodiment may include a first semiconductor chip 210 and a second is semiconductor chip 220.

The first semiconductor chip 210 may include a first buffer 111, a second buffer 112, a first latch 113, a third buffer 114, a second latch 115, a first driver 211, a second driver 213, and a plurality of through vias 212 and 214.

The first buffer 111 is configured to be electrically coupled to a DQS pin and to buffer a data strobe signal DQS inputted through the DQS pin. Thus, the first buffer 111 being capable of receiving a data strobe signal DQS from communicating with an external apparatus located outside the semiconductor apparatus 200.

The second buffer 112 is configured to be electrically coupled to a DQ pin and to buffer data DQ inputted through the DQS pin.

The first latch 113 is configured to latch the data DQ, which has been buffered through the second buffer 112, in response to the data strobe signal DQS.

The third buffer 114 is configured to be electrically coupled to a DBI pin and to buffer a DBI flag inputted through the DBI pin.

The second latch 115 is configured to latch the DBI flag buffered through the third buffer 114.

The first driver 211 is configured to drive the data DQ, which has been latched in the first latch 113, to a level at which the data DQ can be transmitted through the through via 212.

The second driver 213 is configured to drive the DBI flag, which has been latched in the second latch 115, to a level at which the DBI flag can be transmitted through the through via 214.

The plurality of through vias 212 and 214 may include a plurality of through-silicon vias (TSV). The second driver 213 may be configured to drive the DBI flag such that the DBI flag is transmitted through one of the plurality of through vias 212 and 214. As such, the first driver may be configured to drive the data DQ such that the data DQ is transmitted through the other through vias, except for the one through via, among the plurality of through vias 212 and 214.

Although not illustrated in FIG. 2, the first semiconductor chip 210 may include an interface-related circuit block for transferring data in and out of the first semiconductor chip 210. Additionally, data strobe signals DQS, and data bit inversion flags DBI FLAG, etc., may be transferred in and out of the first semiconductor chip 210 through the interface-related circuit block and/or a pin. Thus, data DQ as well as data strobe signals DQS, and data bit inversion flags DBI FLAG, etc., external to the first semiconductor chip 210 may be provided from an external apparatus located outside the first semiconductor chip 210. The data DQ as well as data strobe signals DQS, and data bit inversion flags DBI FLAG, etc., may then be received by the first semiconductor chip 210 through the interface-related circuit block and/or pins. Additionally, the data DQ as well as data strobe signals DQS, and data bit inversion flags DBI FLAG, etc., within the first semiconductor chip 210 may be output to an external apparatus through the interface-related circuit block and/or pins. Also for example, a memory controller through communication with is the first semiconductor chip 210 may control the transferring of data DQ in and out of the first semiconductor chip 210 as well as the transferring of data DQ, data strobe signals DQS, and data bit inversion flags DBI FLAG between the second semiconductor chip 220 and the first semiconductor chip 210.

The second semiconductor chip 220 may include a DBI block 221, an input unit 121 and a memory block 122.

The DBI block 221 is configured to invert the data DQ, which is transmitted through the through via 212, or output the data DQ with an original phase according to the DBI flag transmitted through the through via 214.

The input unit 121 is an element for receiving the data DQ outputted from the DBI block 221, and may include an input buffer, a pipe latch and the like.

The memory block 122 is configured to store the data DQ inputted through the input unit 121.

At this time, the first semiconductor chip 210 may be a master and the second semiconductor chip 220 may be a slave.

The aforementioned embodiments may have a three-dimensional structure, that is, a structure in which a plurality of semiconductor chips have been stacked.

That is, FIG. 2 is illustrated as a block diagram. However, actually, the first semiconductor chip 210 and the second semiconductor chip 220 may have a stack structure.

The second semiconductor chip 220 may be stacked on the is first semiconductor chip 210, and data transmission/reception may be performed between the first semiconductor chip 210 and the second semiconductor chip 220 through the plurality of through vias 212 and 214.

Figure 3:
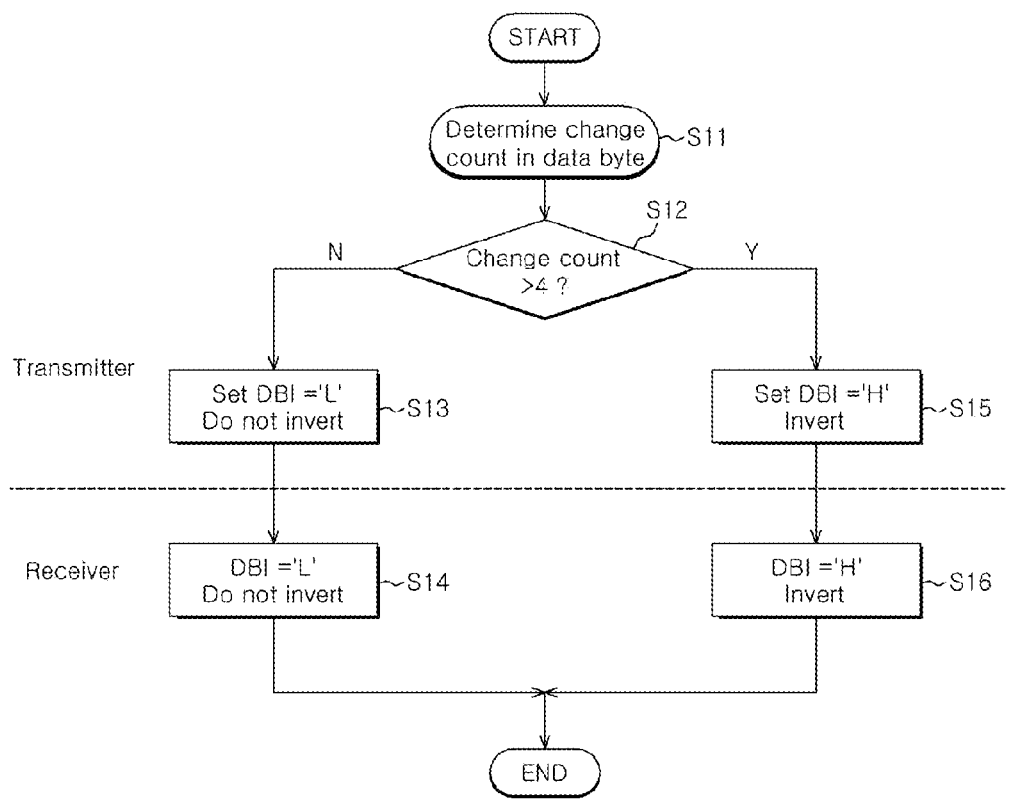
FIG. 3 is a flowchart for explaining a data bit inversion algorithm.

With reference to FIG. 3, an algorithm of a data bit inversion scheme according to the embodiments will be described.

A transmitter counts the number of times by which a logic value of a current write data byte is changed with respect to a previous write data byte (S11).

Additionally, the transmitter may be an external apparatus of the semiconductor apparatuses 100 and 200 (see FIGS. 1 and 2) having the DBI function according to the embodiments, for example, a memory controller.

The transmitter determines whether the number of times, by which the logic value of the current write data byte is changed with respect to the previous write data byte, exceeds a preset number (for example, but not limited to, 4) (S12).

When the number of times, by which the logic value of the current write data byte is changed with respect to the previous write data byte, does not exceed the preset number (for example, 4), the transmitter sets the DBI flag to a logic low L level and outputs corresponding data with an original phase without inverting the corresponding data.

A receiver receives the data transmitted from the transmitter without inverting the data when the DBI flag is at the logic low L level (S14).

At this time, the receiver may be the semiconductor apparatuses 100 and 200 having the DBI function according to the embodiments.

As a result of the determination (S12), when the number of times, by which the logic value of the current write data byte is changed with respect to the previous write data byte, exceeds the preset number (for example, 4), the transmitter sets the DBI flag to a logic high H level and inverts and outputs the corresponding data (S15).

The receiver inverts and receives the data transmitted from the transmitter when the DBI flag is at the logic high H level (S16).

Referring to the DBI SPEC, a DBI flag of one bit is allocated to 8 bits of data. Accordingly, in data transmission as illustrated in FIG. 4, for example, when a DBI flag DBI<i> is at a logic low level (L=0), data DQ<i:i+7> (for example, but not limited to, DQ<i>=0, DQ<i+1>=0, DQ<i+2>=0, DQ<i+3>=0, DQ<i+4>=0, DQ<i+5>=0, DQ<i+6>=0, DQ<i+7>=0) is transmitted with an original phase (resulting in for example, but not limited to, DQ<i>=0, DQ<i+1>=0, DQ<i+2>=0, DQ<i+3>=0, DQ<i+4>=0, DQ<i+5>=0, DQ<i+6>=0, DQ<i+7>=0), and when the DBI flag DBI<i> is at a logic high level (H=1), the data DQ<i:i+7> (for example, but not limited to, DQ<i>=0, DQ<i+1>=0, DQ<i+2>=0, DQ<i+3>=1, DQ<i+4>=1, DQ<i+5>=1, DQ<i+6>=1, DQ<i+7>=1) is inverted and transmitted (resulting in for example, but not limited to, DQ<i>=1, DQ<i+1>=1, DQ<i+2>=1, DQ<i+3>=0, DQ<i+4>=0, DQ<i+5>=0, DQ<i+6>=0, DQ<i+7>=0).

Figure 4:
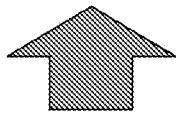
FIG. 4 is a diagram illustrating an example of data bit inversion in a data transmission operation.
Figure 5:
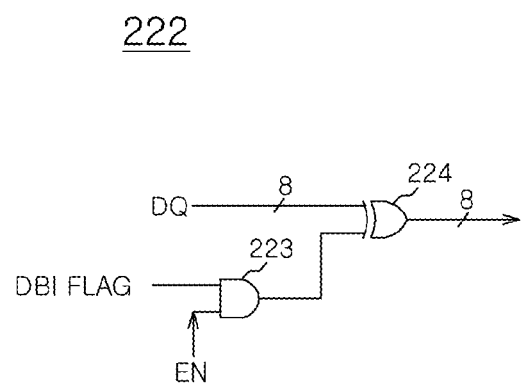
FIG. 5 is a circuit diagram an internal configuration 222 of a DBI block 221 of FIG. 2.

Referring to FIG. 5, the DBI block 221 of FIG. 2 may include a circuit configuration 222 for the DBI operation described in FIG. 3 and FIG. 4.

The circuit configuration 222 may include an AND gate 223 and a plurality of XOR gates 224.

The AND gate 223 performs an AND operation on an enable signal EN and a DBI flag and outputs a result of the AND operation.

That is, the AND gate 223 provides the plurality of XOR gates 224 with the DBI flag when the enable signal EN has been activated.

Additionally, the enable signal EN may be provided from an internal circuit configuration of the semiconductor apparatus 200, for example, a mode register.

The plurality of XOR gates 224 perform an XOR operation on a plurality of data DQ (for example, but not limited to, 8 bits of data) and the DBI flag, outputs data DQ (for example, but not limited to, 8 bits of data) with an inverted or original phase.

Additionally, the semiconductor apparatus 100 having the DBI function according to the embodiments described in FIG. 1 allows the first semiconductor chip 110 to perform the DBI function, that is, the operation for inverting the data transmitted from the transmitter according to the DBI flag.

When the DBI function is performed, it is possible to reduce is current consumption in a data transmission process.

The semiconductor apparatus 200 having the DBI function according to the embodiments described in FIG. 2 allows the second semiconductor chip 220 to perform the DBI function.

According to the embodiments described in FIG. 2, a semiconductor chip after through vias for signal exchange between stacked semiconductor chips in a stacked semiconductor apparatus, that is, the second semiconductor chip 220 performs the DBI function, so that it is possible to additionally reduce current for TSV transmission as well as current for the DBI function.

While various embodiments have been described above, it will be understood to those skilled in the art that the embodiments described are by way of example only. Accordingly, the semiconductor apparatus having a data bit inversion function described herein should not be limited based on the described embodiments. Rather, the semiconductor apparatus having a data bit inversion function described herein should only be limited in light of the claims that follow when taken in conjunction with the above description and accompanying drawings.

What is claimed is:

1. A semiconductor apparatus having a data bit inversion function, the semiconductor apparatus comprising:
   a first semiconductor chip; and
   a second semiconductor chip electrically coupled to the first semiconductor chip,
   wherein the first semiconductor chip is configured to receive data and a data bit inversion flag, and transfer the data to the second semiconductor chip, and
   wherein the second semiconductor chip is configured to invert and store the data, which is transferred from the first semiconductor chip, according to the data bit inversion flag.

2. The semiconductor apparatus having a data bit inversion function according to claim 1, further comprising:
   a plurality of through vias electrically coupled between the first semiconductor chip and the second semiconductor chip.

3. The semiconductor apparatus having a data bit inversion function according to claim 2, wherein the first semiconductor chip is configured to transfer the data and the data bit inversion flag to the second semiconductor chip through the plurality of through vias.

4. A semiconductor apparatus having a data bit inversion function, the semiconductor apparatus comprising:
   a first semiconductor chip configured to receive data and a data bit inversion flag from outside the semiconductor apparatus; and
   a second semiconductor chip configured to be stacked on the first semiconductor chip and to receive the data and the data bit inversion flag through a plurality of through vias,
   wherein the second semiconductor chip is configured to invert and store the data according to the data bit inversion flag.

5. The semiconductor apparatus having a data bit inversion function according to claim 4, wherein the first semiconductor chip comprises:
   a second driver configured to drive the data bit inversion flag such that the data bit inversion flag is transmitted through one of the plurality of through vias; and
   a first driver configured to drive the data such that the data is transmitted through the other through vias, except for the one through via, among the plurality of through vias.

6. The semiconductor apparatus having a data bit inversion function according to claim 4, wherein the first semiconductor chip has a data bit inversion function including receiving a data strobe signal from outside the semiconductor apparatus.

7. The semiconductor apparatus having a data bit inversion function according to claim 6, wherein the first semiconductor chip comprises:
   a first latch configured to latch the data in response to the data strobe signal;
   a second latch configured to latch the data bit inversion flag in response to the data strobe signal;

a second driver configured to drive the data bit inversion flag latched through the second latch such that the data bit inversion flag is transmitted through one of the plurality of through vias; and a first driver configured to drive the data latched through the first latch such that the data is transmitted through the other through vias, except for the one through via, among the plurality of through vias.

8. The semiconductor apparatus having a data bit inversion function according to claim 4, wherein the second semiconductor chip comprises:

a data bit inversion block configured to invert the data or output the data with an original phase according to the data bit inversion flag; and a memory block configured to store the data outputted from the data bit inversion block.

* * * * *